(12) United States Patent
Haila et al.

(10) Patent No.: US 7,570,116 B2
(45) Date of Patent: Aug. 4, 2009

(54) OUTPUT STAGE

(75) Inventors: Olli Haila, Piikkio (FI); Song Qin, Shanghai (CN); Bin Shao, Shanghai (CN)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/801,653

(22) Filed: May 10, 2007

(65) Prior Publication Data
US 2008/0278234 A1   Nov. 13, 2008

(51) Int. Cl.
   *H03F 3/18*   (2006.01)
(52) U.S. Cl. .................. 330/264; 330/255
(58) Field of Classification Search .......... 330/264, 330/255, 263
   See application file for complete search history.

(56) References Cited

U.S. PATENT DOCUMENTS

| 4,912,425 | A  | * | 3/1990 | Kobayashi et al. .......... 330/253 |
| 6,384,685 | B1 | * | 5/2002 | Juang ......................... 330/264 |
| 6,784,739 | B2 | * | 8/2004 | Reffay et al. ................ 330/264 |
| 6,794,942 | B2 | * | 9/2004 | Smith ......................... 330/264 |

* cited by examiner

*Primary Examiner*—Henry K Choe
(74) *Attorney, Agent, or Firm*—Wolf, Greenfield & Sacks, P.C.

(57) ABSTRACT

An output stage, comprising a first transistor operable to pull a voltage at an output node towards a first voltage, and a rechargeable energy store having a potential difference between first and second terminals wherein the rechargeable energy store is arranged to be controllably connected between the output node and a second voltage supply such that the voltage at the output node can be driven to a voltage outside of a range defined between the first and second voltages.

23 Claims, 13 Drawing Sheets

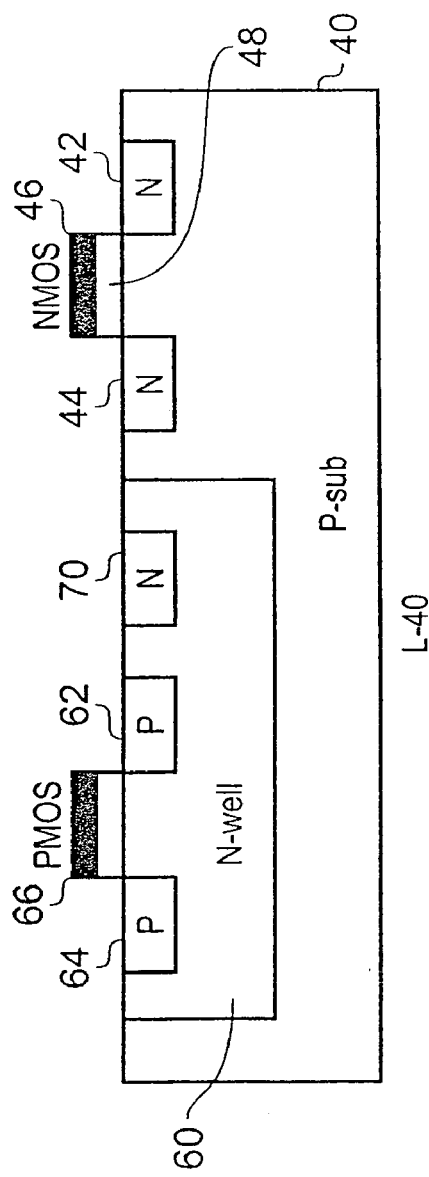
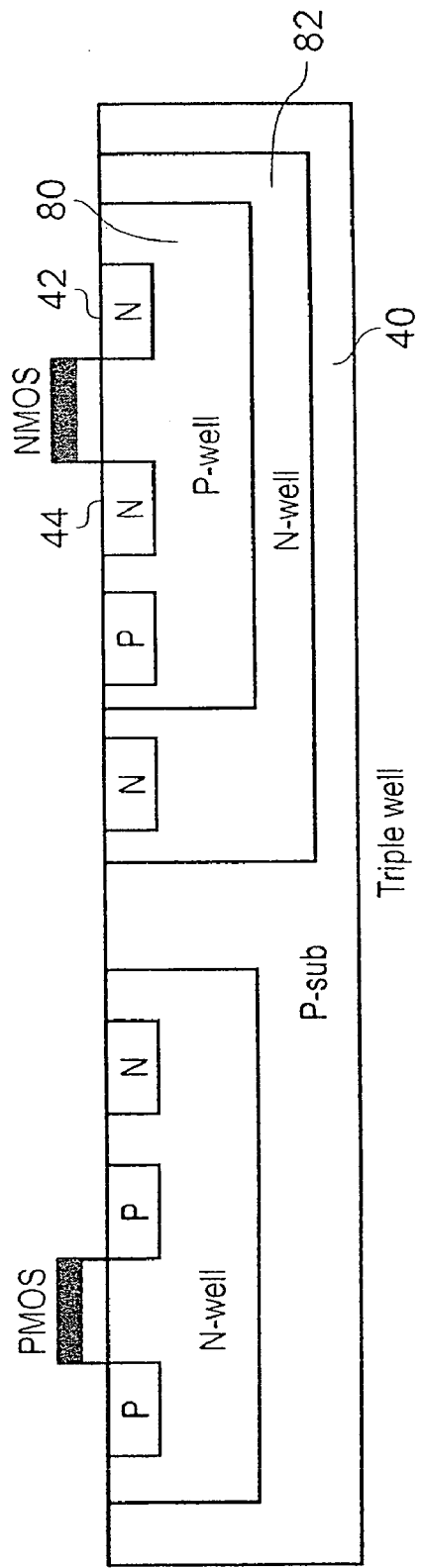
Fig. 3 (Prior Art)
Fig. 4 (Prior Art)

OUTPUT STAGE

FIELD OF THE INVENTION

The present invention relates to an output stage and an amplifier including such an output stage.

BACKGROUND OF THE INVENTION

It is known that the class B or class AB output stage using complementary push-pull transistors can be used to drive a load. FIG. 1 schematically illustrates such an output stage where a preamplifier, generally designated 2, generates drive signals to control first and second transistors 4 and 8 in a complementary manner such that the first transistor 4 is driven to be conducting during positive half cycles so as to pull the voltage at an output node 6 up towards the positive supply, +V, whereas a second transistor 8 is driven conducting during the negative half cycles so as to pull the voltage back to node 6 down towards the negative supply rail V−. In battery powered equipment the potential difference between the positive supply rail, +V, and the negative supply rail, which in practice is a local ground, can be quite small. Thus, in the context of hearing aids, headsets, music players or mobile telephones the voltage range might be as little as 1.5 volts. This restricts the voltage swing that can be obtained at the output node 6.

Where space is not an issue, then the peak to peak voltage range at the output transducer can be shifted by the inclusion of a DC blocking capacitor at the output node 6. However in order to achieve acceptable lower frequency bandwidth (for example 20 Hz), with audio applications typically having 16 Ohm loads, then the capacitor needs to have a size of 330 micro Farads. Within the context of integrated circuits, this represents a large component with an unacceptably high implementation cost.

In certain applications, it is possible to gain access to the terminals at either side of the output transducer and in such circumstances the effective voltage swing across the transducer can be increased by driving it within a "H bridge" circuit arrangement. However this is not always possible.

A common example of a device where reasonable to loud audio amplitude output is required, but where it is not possible to drive the transducer within an H bridge is the mobile telephone. Here, as illustrated in FIG. 2, the left and right earpiece transducers 10 and 12 share a common return line to a headphone jack, generally designated 14. Thus within this arrangement the common return must be held at a common voltage in order to reduce cross talk or to comply with the commonly used configuration of the headphone jack, and this is generally the local ground (i.e. negative battery potential) within the mobile device. This therefore reduces the output swing which can be provided to the left and right channels (designated A and B) from a stereo output amplifier 16. The common return line may also be shared with input devices, such as a microphone, which precludes use of an H bridge drive arrangement.

Returning to FIG. 1, one way to enhance the output amplitude would be to use a charge pump to generate a negative reference voltage, V−, such that the transistor 8 could pull the load voltage down from ground to V−. Charge pumps are well known to the person skilled in the art and consequently this is, at least initially, a very tempting possibility. However, within the context of an integrated circuit there are significant cost penalties incurred in building an integrated circuit where the output transistor 8 can connect to a negative reference voltage which lies below the ground voltage (e.g. as provided by the negative terminal of the battery) connected to the substrate of the integrated circuit and these problems will be discussed shortly. Whilst running the entire integrated circuit between the V+ and V− voltages would overcome the difficulties associated with integrated circuit fabrication, this would be at the cost of increasing the voltage difference across the integrated circuit as a whole, and hence increasing the power dissipation within the integrated circuit and consequently shortening battery life within a mobile device having such a circuit. This, therefore, is clearly undesirable, especially in devices where manufacturers strive to archive long "stand by" times.

It is worthwhile considering the formation of an integrated circuit in order to see where these problems arise. It is also worth bearing in mind that devices such as mobile telephones and Bluetooth headsets require the integration of highly complex digital processing circuitry together with RF and analog circuitry. It is also worth noting that the standard CMOS application process for creating digital circuitry can be used to form analog amplifiers. FIG. 3 schematically shows the formation of a P type transistor and an N type transistor within the standard CMOS fabrication process which is well known to the person skilled in the art and which is readily available at a large number of semiconductor fabrication facilities around the world. Within the standard CMOS chip a substrate 40 is doped with a P type impurity. Then, in order to form an N type transistor first and second regions 42 and 44 are doped with an N type impurity in order to form the source and drain of a field effect transistor. A conducting electrode 46 is then formed within the space between the regions 42 and 44 in order to form the gate. The gate 46 is insulated from the P type substrate 40 via a thin insulating layer 48 often of silicon dioxide. The interface between the N doped regions 42 and 44 and the P doped substrate 40 forms a parasitic diode, but this remains reversed biased, and consequently non-conducting, whilst the voltages within the N doped regions 42 and 44 remain higher than the voltage at the P type substrate 40.

In order to form a PMOS transistor it is necessary to dope a region of the substrate with an N type dopant in order to form an N-well 60. Then first and second regions 62 and 64 are doped with a P type material in order to form the source and drain of the PMOS field effect transistor. A gate electrode 66 is formed between the drain and source regions. The interface between the source and drain regions 62 and 64, and the N well 60 has the potential to form parasitic diodes, but these remain turned off provided that the potential in the N well is not less than the potential of the source and drain regions. In order to achieve this a further connection, known as a back gate 70 is provided such that the voltage at the N well can be held positive with respect to the potential of the P type substrate and the potentials of the source and drain terminals, or equal to the most positive of all three.

It can be seen from inspection of FIG. 1 in combination with FIG. 3 that where one of the first transistors is an NMOS device, trying to run the output node 6 at a voltage below the voltage of the P type substrate 40 will switch on parasitic diodes associated with the NMOS transistor.

However, if it is desired to be able to use the PMOS and NMOS transistors within a CMOS output stage capable of operating at a voltage below the potential of the P type substrate, then additional processing steps must be undertaken around the NMOS transistor in order to modify it. FIG. 4 shows a CMOS output stage where the NMOS transistor can operate at voltages below the potential of the substrate of the integrated circuit. In order to achieve this the standard NMOS transistor needs to be formed within its separate P well 80 which itself must be formed within an N well 82 within the P type substrate 40. Individual electrodes are connected to the P well 80 and the N well 82 such that the potential of these wells can be controlled in order to form back to back reverse biased diodes in order to prevent charge leakage from the source or drain terminals 42 and 44 of the NMOS transistor to the P type substrate. This formation of additional sub wells increases the complexity of fabrication of the semiconductor die.

SUMMARY OF THE INVENTION

According to a first aspect of the present invention there is provided an output stage, comprising a first transistor operable to pull a voltage at an output node towards a first voltage supply, and a rechargeable energy store having a potential difference between first and second terminals wherein the rechargeable energy store is arranged to be selectively placed in current flow communication between the output node and a second voltage supply such that the voltage at the output node can be driven to a voltage outside of a range defined between the first and second voltages.

It is also possible to drive the voltage at the output node to a voltage within the range between the first and second voltages.

It is thus possible to provide an output stage which can exhibit the peak to peak voltage swing that can be achieved whilst running the output stage at +V and −V, reference with respect to the substrate, whilst only using a conventional (e.g. single well) CMOS fabrication process where the NMOS transistors within the integrated circuit only operate between +V and the substrate's potential. As a consequence the supply voltages for the integrated circuit can also be limited to +V and ground (the substrate's voltage). This gives, for example, enhanced audio output amplitude within a mobile device, such as a mobile telephone, without needing the use of more complex and consequently more costly fabrication process in order to form the integrated circuits of the device. This is of significant benefit in the manufacture of products, such as mobile telephones, which are manufactured in large numbers.

Advantageously the rechargeable store can be selectively recharged in order to prevent it becoming depleted. In an embodiment of the present invention the rechargeable store is used to energize an output transducer during negative half cycles of the output of an amplifier having an output stage constituting an embodiment of the present invention. The time taken to recharge the rechargeable store is significantly less than the half cycle time of the highest in-band frequency of interest and consequently one or more recharges can be achieved within the negative half cycle. The recharge does not significantly degrade the performance of the output stage.

Advantageously where the amplifier operates in a closed loop mode, output errors resulting during the recharge process are compensated for by the closed loop such that the total amount of energy delivered into the transducer during the half cycle is substantially correct. However open loop operation is also possible.

The rechargeable energy store is advantageously provided as a capacitor. The ability to recharge the capacitor during use means that the capacitor behaves as if it stored more charge than it is physically able to do for a given potential difference across the capacitor. Thus the combination of the capacitor and a recharge circuit can be regarded as an apparatus for synthesising a capacitor of a first size from an electrically smaller capacitor.

The recharge circuit may include switches for connecting the energy store or capacitor to a voltage supply during recharging. Optionally additional switches may be provided for removing the capacitor from the output state during recharging. Alternatively the output stage or a driver or preamplifier for the output stage may be modified such that it acts to shut off current flow through the output stage during recharging of energy store.

A plurality of energy stores may be provided and switches may be provided in association with the energy stores such that different energy stores may be selected for use at different times, either singularly or in combination with other ones of the stores.

According to a second aspect of the present invention there is provided an output stage where a least one device is operable to control a voltage occurring at an internal node, and wherein at least one rechargeable voltage store is arranged to be selectively connected between an output node and the internal node such that the voltage at the output node is the sum of the voltage across the or each rechargeable voltage store connected between the internal node and the output node and the voltage at the internal node.

According to a third aspect of the present invention there is provided a method of modifying the voltage swing available at an output of an output stage which has a first transistor operable to pull a voltage at an output node towards a first supply voltage and a second transistor, wherein the method comprises providing a rechargeable energy store having a voltage of +$V_{FC}$ volts across its terminals interposed between the second transistor and the output node, and the second transistor is operable to control current flow between the output node and a second supply rail.

According to a fourth aspect of the present invention there is provided a recharge control system comprising a load current monitor for measuring a load current, a recharge current monitor for monitoring a recharge current and a controller responsive to the recharge current monitor and the load current monitor and arranged to compare the load current and the recharge current and to modulate the recharge current as a function of the comparison.

BRIEF DESCRIPTION OF THE DRAWINGS

The present invention will further be described, by way of example only, with reference to the accompanying Figures, in which:

FIG. 3 shows in simplified form the doping required to form NMOS and PMOS transistors within a standard CMOS process;

FIG. 4 shows in simplified form the doping required to form NMOS and PMOS transistors where the NMOS transistor is operable at potentials below those of the P type substrate of the integrated circuit;

DESCRIPTION OF PREFERRED EMBODIMENTS OF THE INVENTION

Figure 1:
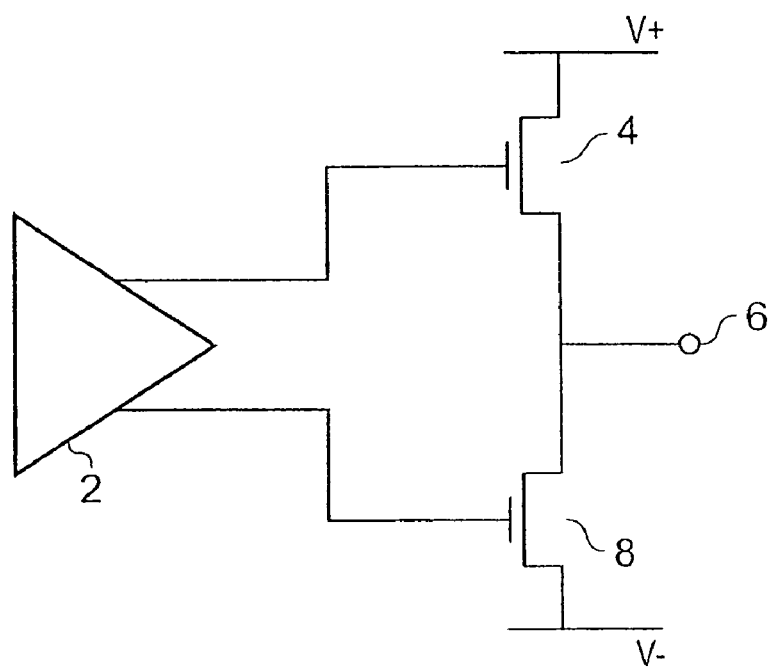
FIG. 1 schematically illustrates a push-pull output stage of a prior art amplifier.
Figure 5:
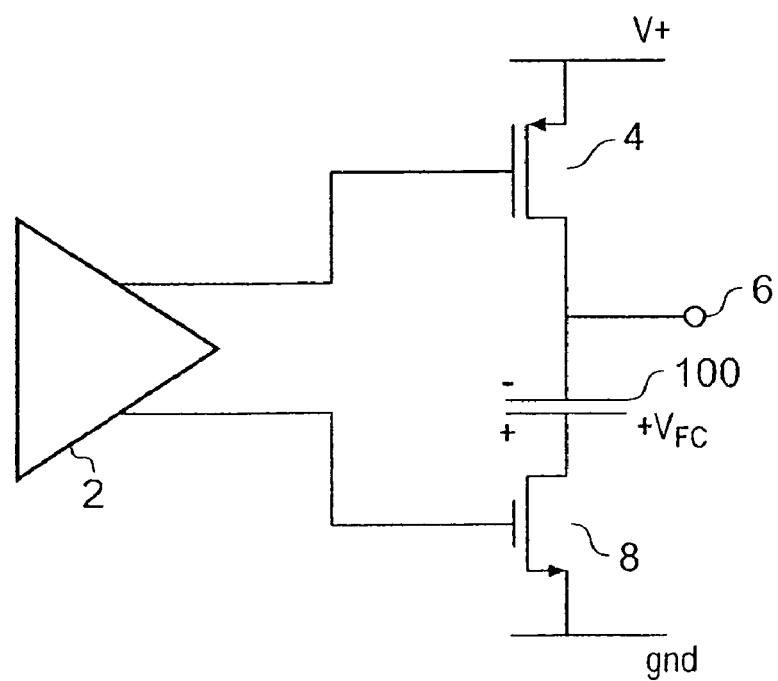
FIG. 5 shows in conceptualised form an embodiment of the present invention.
Figure 2:
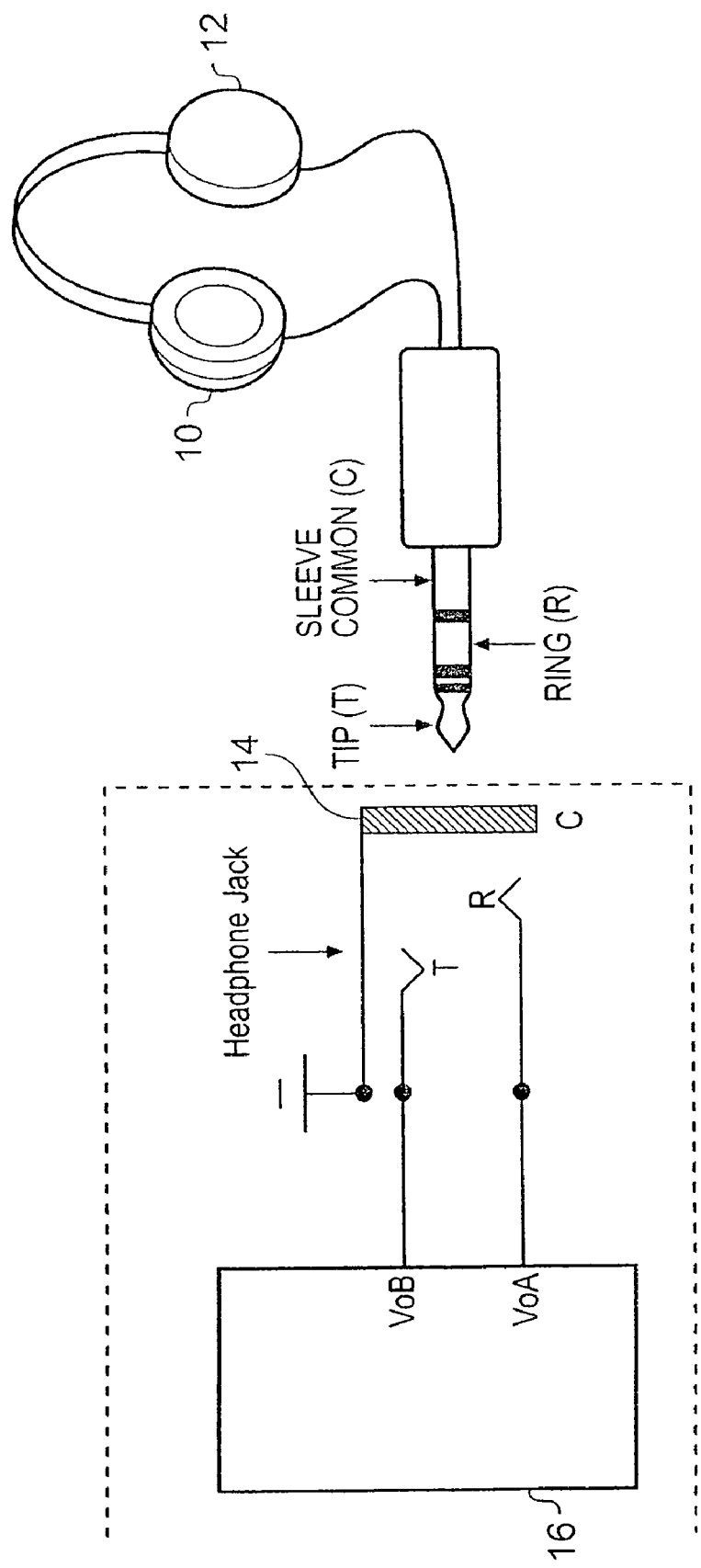
FIG. 2 schematically illustrates the connections between a stereo amplifier and left and right channels via a jack having a common ground.

FIG. 5 shows, in highly conceptualised terms, an output stage constituting an embodiment of the present invention. Conceptually the stage is quite similar to that of the conventional totem pole output stage shown in FIG. 1 in that first and second transistors 4 and 8 are provided in a series connected arrangement between the positive supply V+ and a local ground "GND" which may be provided by a single battery. An output node 6 represents the output of the output stage and consequently it can be seen that the first transistor 4 can be switched into a conducting state by the preamplifier 2 so as to pull the output node 6 towards V+. It can also be seen that, in the absence of any further components, the second transistor 8 could be switched on to pull the voltage at the output node 6 towards ground/the voltage applied to the substrate of the integrated circuit. However, in the present invention a floating voltage source 100, (which, in use, floats with respect to the supply voltages but not with respect to the output voltage—except during recharge as will be described later) is connected between the output node 6 and the transistor 8. Suppose, for simplicity, that the floating voltage source 100 has a voltage $+V_{FC}$ occurring across it such that when the first transistor 4 is not conducting the voltage at the output node 6 (in the absence of any load) would be $-V_{FC}$ volts less than the voltage occurring at the interconnection between the voltage source 100 and the second transistor 8. Put another way, if the voltage drop across the second transistor 8 is $V_2$, then the output voltage at the output node 6 is $V_2-V_{FC}$ measured with respect to the local ground.

If we consider the operation of this circuit in simplistic terms, it can be seen that when transistor 8 is non conducting then the voltage source 100 simply floats together with the potential at the output node 6 and hence transistor 4 can pull the voltage at the output node 6 up to the voltage V+, less any small voltage dropped across the transistor 4 due, for example, to resistive losses therein when a current is flowing. It can also be seen that, when transistor 4 is non-conducting and transistor 8 is conducting then effectively the lowermost terminal (as shown in FIG. 5) of the floating voltage source can be connected to ground through the transistor 8 and consequently the voltage at the output node 6 can be reduced to $-V_{FC}$ volts with respect to ground. It can also be seen that the transistors 4 and 8 need not be driven hard on and hard off but could be driven in a linear manner in order to control the voltage at the node 6 to assume any desired voltage lying within the range V+ to $-V_{FC}$, measured with respect to the local ground.

Such an arrangement is relatively well suited to being implemented within CMOS transistors fabricated using the standard CMOS process as will now be explained.

Looking at FIG. 5, it can be seen that the source terminal of transistor 4 is always held at V+, whereas the drain terminal may be required to go as negative as $-V_{FC}$. From brief inspection of the configuration of CMOS transistor (FIG. 3), it can be seen that this can be tolerated if transistor 4 is a PMOS transistor. If the back gate 70 of the N well 60 of the PMOS transistor is generally held close V+ then it can be seen that the potential difference between the drain terminal and the N well 60 is never sufficient to switch the parasitic diode formed therebetween on. Similar considerations apply to the source terminal. Furthermore, with the N well 60 being held above the potential of the P substrate 40 again this junction forms a reverse biased diode such that no parasitic leakage occurs. Finally, the drain 62 of the PMOS transistor may go negative with respect to the ground voltage but the junction between the drain 62 and the N well 60 will always form a reverse biased diode so again no parasitic problems occur. Similarly, if transistor 8 is formed as an NMOS transistor then its drain source voltages are always above ground and consequently this transistor works in its normal operating range. It can therefore be seen that an enhancement of the output range of the output stage is achievable provided that the floating energy store can maintain an energy difference of $V_{FC}$ across it. It should be noted that $V_{FC}$ need not be a constant value.

Figure 6:
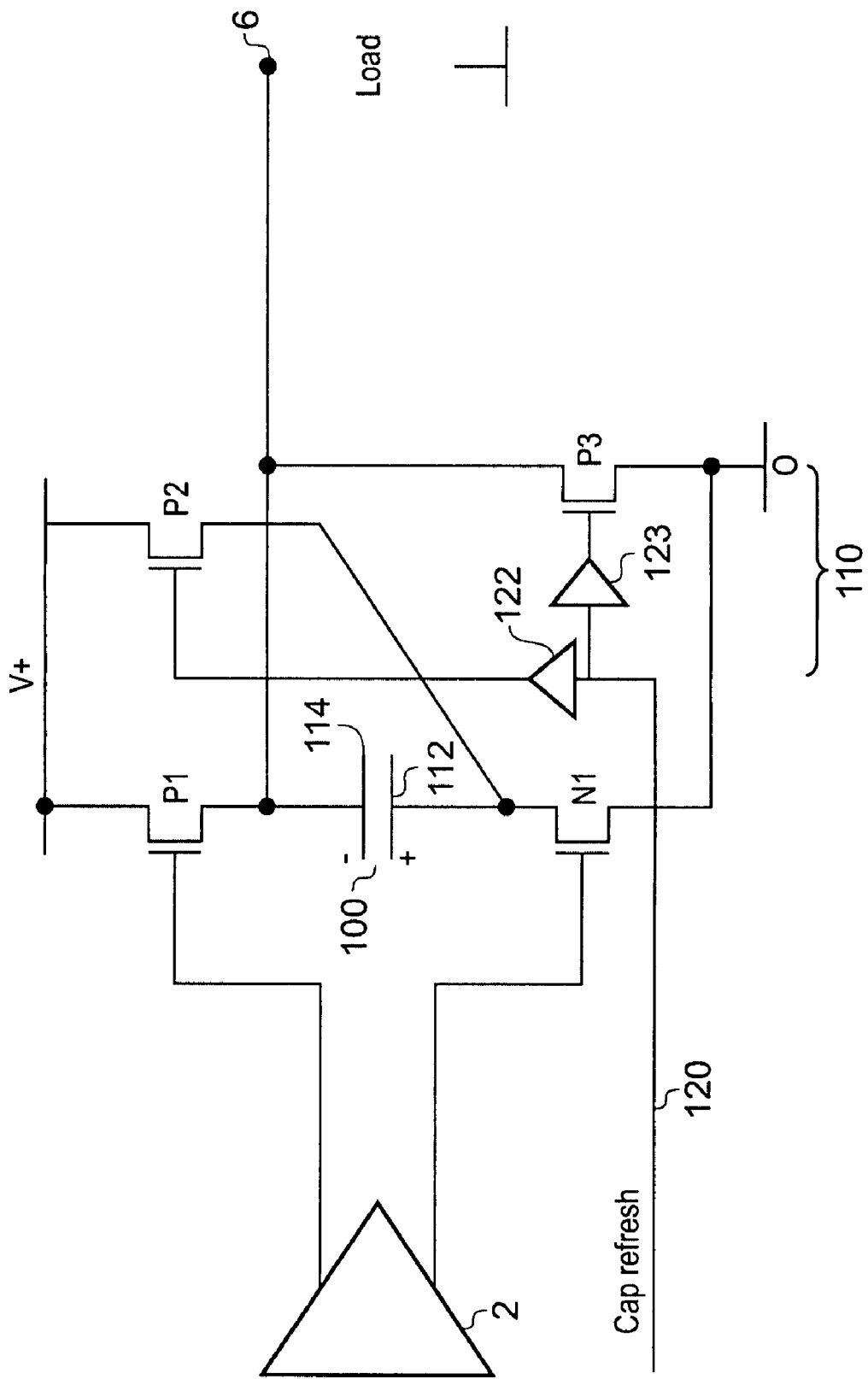
FIG. 6 is a circuit diagram of an output stage constituting a first embodiment of the present invention.

FIG. 6 schematically illustrates a first embodiment of the present invention. In order to assist in identifying the transistor types, PMOS transistors will be designated with a P, whereas NMOS transistors are designated with an N. Therefore, as can be seen, a first transistor P1 extends between the positive supply rail V+ and the output node 6. Similarly, and as shown in FIG. 5, the rechargeable energy store 100 has a negative terminal 114 connected to the output node 6 and a positive terminal 112 connected to the drain of a first N type MOSFET N1 whose source is connected to the local ground/zero volt supply. The transistors P1 and N1 are driven by the preamplifier stage 2. The energy store 100 can be constituted by a capacitor as capacitors are relatively easy to fabricate within an integrated circuit. The capacitor may also be a small external component. However, it can be seen that when the second transistor N1 is conducting that current flow occurs through the capacitor 100 and that the energy stored therein is discharged to the load. As the current flows through the capacitor the voltage across the capacitor terminals will drop. It is therefore necessary to provide a recharge arrangement, generally designated 110, for recharging the capacitor 100. The recharge arrangement comprises a third transistor, P2, which is a PMOS transistor which has its source terminal connected to the positive rail V+ and its drain terminal connected to the positive plate 112 of the capacitor 100. A fourth transistor P3 which is an PMOS transistor has its drain/source connected to the negative plate 114 of the capacitor (this corresponds to connecting to the output node 6) and its source/drain connected to the ground rail 0V. It should be noted that P3 could be replaced by an NMOS device in series with a protection diode.

It can be seen that, if both the first and second transistors P1 and N1 are switched to a non-conducting state then the capacitor 100 can be recharged such that its positive plate 112 is more positive than its negative plate 114 by switching the third transistor P2 on thereby effectively connecting the positive plate 112 to the positive supply V+ and by switching the fourth transistor P3 on thereby connecting the negative plate 114 to ground. This can be achieved by asserting a "cap refresh" signal 120 which in this embodiment is active when low and which is provided to the gate of the fourth transistor P3 thereby switching it into a conducting state. An level shifter 122 may optionally be provided in the path to the gate of the third transistor P2. A similar level shifter 123 may condition the signal provided to P3. When the "cap refresh" signal is reset, i.e. taken high, then both transistors P2 and P3 switch off and the recharged capacitor can then be used once again in conjunction with the second transistor N1 to take the voltage at the output node 6 negative with respect to the local ground, 0V.

As noted before, the voltage across the capacitor $V_{FC}$ need not be a constant value. This can be exploited to provide further increase in system efficiency. Referring back to FIG. 6, it can be seen that if $$V_{FC} = \frac{V+}{2}$$

and P2 is configured such that it can be used to drive the load in a linear fashion, then the current into the load during a positive half cycle can be driven through transistor P2, whereas during the negative half cycle the current is driven through transistor N1. In this regime transistors P1 and P3 need not be active at all. Thus the current coming from P2 during the positive half cycle charges the capacitor 100, and this charge is then discharged to the load during the negative half cycle. In this regime a refresh to the capacitor 100 is not required and the capacitor 100 effectively halves the voltage supply and doubles the efficiency whilst still providing a level shifting function. However this improved efficiency is only achievable if the charge stored in the capacitor 100 is sufficient to provide the energy for the next full half cycle. As such, this regime is most likely to be entered when the signal amplitude is low. As the signal amplitude increases then the mode of operation can be changed, for example to a mixed mode, where small amplitudes are dealt with by control of transistors P2 and N1, and larger amplitudes are dealt with by switching transistors P1 and N1, and then engaging in recharge events using transistors P2 and P3. This mixed mode of operation is beneficial because the class AB output stage efficiency is worst at low signal amplitude. Thus we get the benefit of increasing efficiency at low amplitudes, whilst also increasing the peak to peak voltage range that can be output to the load.

Although the arrangement shown in FIG. 6 works well, the recharging scheme has some disadvantages. Firstly, the recharge current is to a first approximation, determined solely by the capacitance of the capacitor in combination with the on resistance of the third and fourth transistors and the voltage across the transistors. The standard CMOS process seeks to make these resistances as low as reasonably possible and as a consequence relatively large transient currents may flow during the capacitor recharge. This can give rise to stress in the circuit's power supply. It can also be a cause of electromagnetic interference. This is not necessarily a problem in many systems, but where sensitivity to electromagnetic interference is expected to be a problem then it is desirable to be able to control the charge current. It can also be expected that the inter-charging interval will be proportional to the output current required by the load. This gives the option to have the recharging occur at a irregular spacings in time which has the advantage of smearing the interference generated during recharging out across the frequency spectrum. The smearing effect can be further enhanced by varying the recharge current which in turn modifies the amount of recharging that occurs during each recharge instance and consequently can further randomise the inter-charge interval that is required between succeeding recharges.

Figure 7:
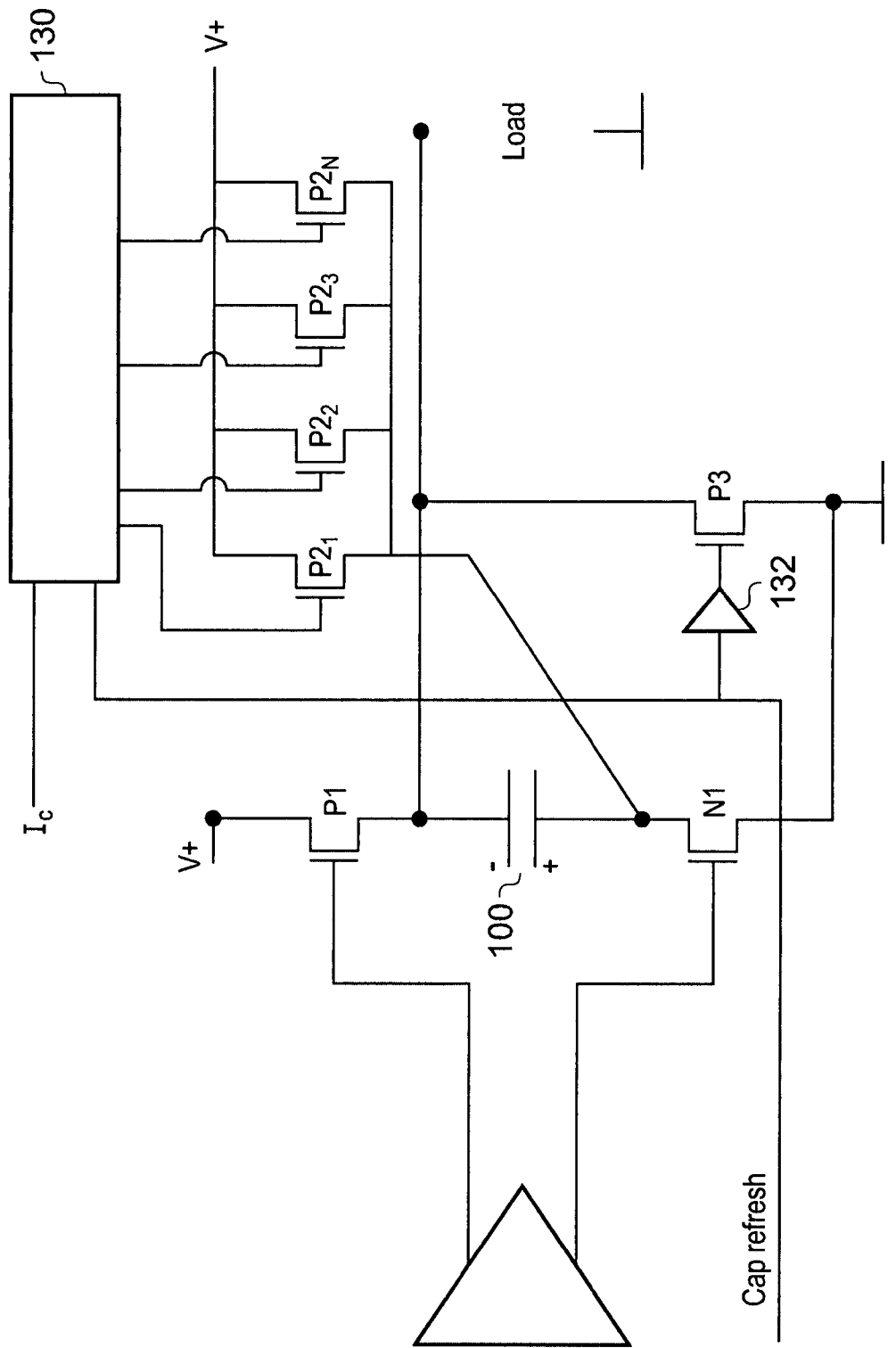
FIG. 7 is a circuit diagram of an output stage constituting a second embodiment of the present invention.

FIG. 7 schematically illustrates a modification to the arrangement shown in FIG. 6 where the third transistor is now replaced by a parallel bank of P type transistors $P2_1$, $P2_2$, $P2_3 \ldots P2_N$. Each of the transistors $P2_1$ to $P2_N$ has its gate connected to a switching controller 130 which has an input responsive to the "cap refresh" signal such that the controller 130 can switch one or more of the transistors $P2_1$ to $P2_N$ on. A level shifter 132 may be provided to shift the drive voltage level to P3, or it may be omitted. Each transistor is smaller than would be the case if only a single switching transistor were used and hence each exhibits a higher internal resistance $R_{DS}$-on when switched fully on. Therefore the charging current can be modulated by controlling the number of transistors which are switched on. The controller 130 is responsive to a charge current demand signal $I_C$ which can be derived in an open loop manner by making the assumption that the charging current should be related to the expected load current. It should be noted that in-rush currents to the capacitor could also be limited by deliberately extending the transition time for the transistors $P2_1$ to $P2_N$ to switch from being non-conducting to being conducting. This may, however, increase the dissipation within the devices and may require use of a larger die or the need for a package with lower thermal resistance.

The controller 130 can act to switch one or more of the transistors on, thereby modulating the current flow into the capacitor 100. Where multiple transistors are to be switched on, then they can either be switched on in one go, or their switch on times can be slightly staggered. Staggering the switch on further smears out radio frequency interference resulting from the recharge process. The selection of the transistors involved may also be randomised.

The refresh current may be estimated based on the load and signal amplitude. However, this is likely to be difficult and instead it may be preferable to sense the load current and the refresh current at a recharge instant and to use this data to control the number of transistors $P2_1$ to $P2_N$ that are switched on at the subsequent charging instant.

In order to do this, means need to be provided for measuring the refresh and load currents. It would be possible to interpose measuring devices within the circuit. For example small known resistances could be inserted in the recharge path and the current path through transistor N1, and the voltage drops that occur could be measured so as to indicate the current flow. However this has the disadvantage of perturbing the operation of the amplifier and the refresh circuit.

An alternative approach is to fabricate additional charge transistors and an output stage that can be used to replicate the performance of the output stage and the recharge circuit. Such circuits will be discussed later.

Figure 8A:
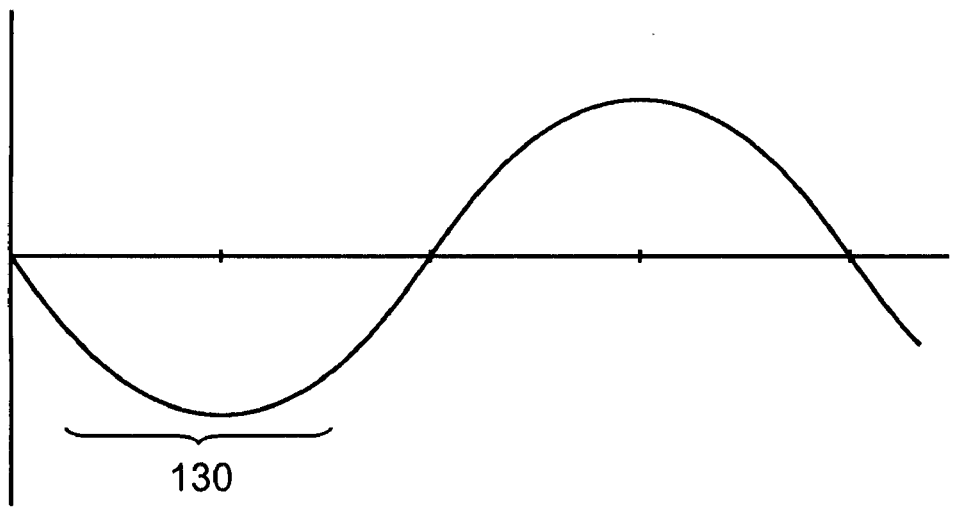
FIGS. 8a and 8b compare an input waveform to an amplifier constituting an embodiment of the present invention with an output waveform from the amplifier.
Figure 8B:
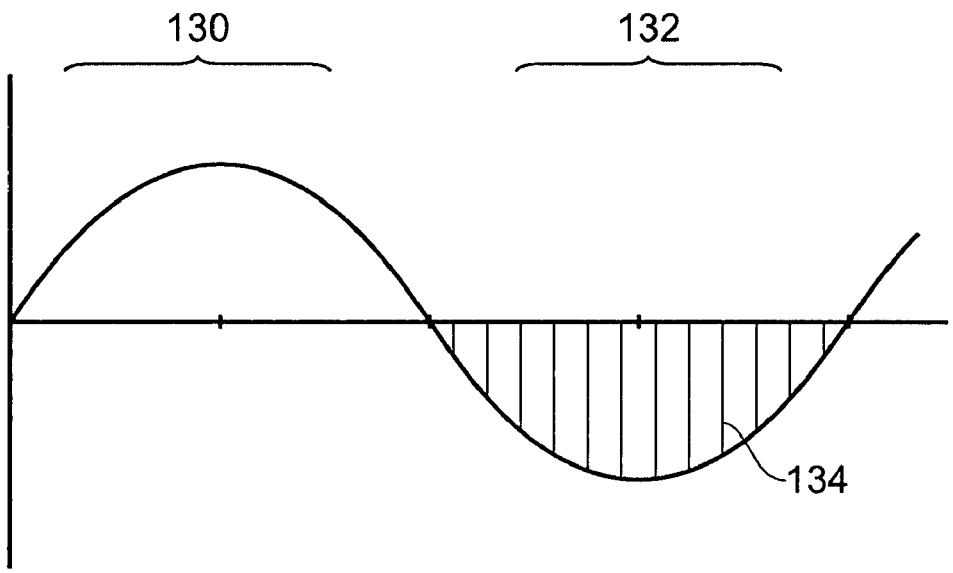

FIGS. 8a and b compare the voltage at the output of the output stage with respect to a voltage at the input of an inverting amplifier constituting an embodiment of the present invention. FIG. 8a represents the input, whereas FIG. 8b represents the output. It can be seen that, during the positive half cycle, generally designated 130, the voltage at the output node 6 follows the input voltage. This is because current flow only occurs via the field effect transistor P1. However, during the negative half cycle current flows through transistor N1 and through the floating voltage source 100. Therefore the capacitor 100 becomes discharged by the current flow through it and the voltage across its terminals decreases. It is therefore necessary to operate the recharge circuit to recharge the capacitor during the negative half cycle 132. The recharge instance causes the voltage at the output node to briefly tend towards 0 V, as is diagrammatically shown by the vertical lines 134 in FIG. 8b. It can be seen that the frequency of the recharging increases with increasing output voltage amplitude, and hence increase in current flow through the capacitor 100. It should be noted that it is also possible to recharge the capacitor during the positive half cycle, either through the recharge circuit or through N1.

Figure 9A:
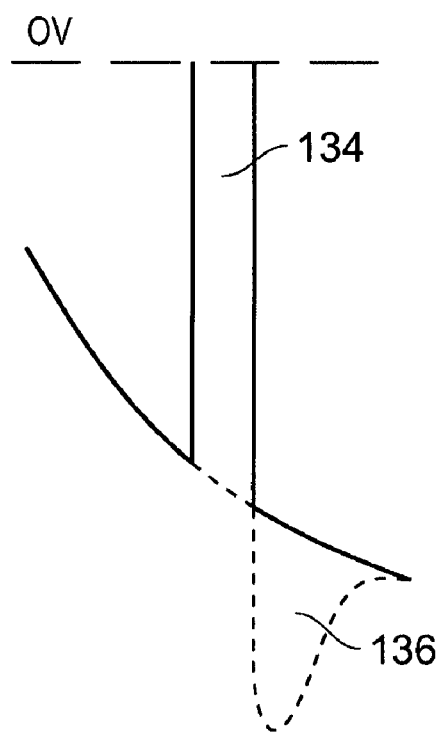
FIGS. 9a and 9b illustrates the transitions occurring at a charging event in greater detail.
Figure 9B:
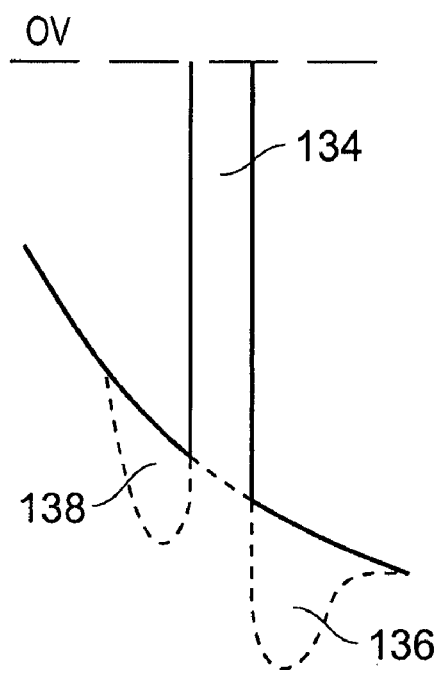

Although the excursions towards 0 V designated 134 in FIG. 8*b* are shown as near instantaneous, in fact each excursion has a finite duration as shown in greater detail in FIGS. 9*a* and 9*b*. It can be seen that the enclosed area 134 of the excursion shown in FIG. 9*a* causes energy to be removed from the output signal. That energy can be schematically represented as the area enclosed within the rectangle 134. The inventor noted that some of this energy can be returned to the transducer by allowing some overshoot to occur within a second area designated 136. Furthermore the inventor also noted that a pre-distortion could be introduced into a third area designated 138, as shown in FIG. 9*b*. Where pre-distortion is provided, it is desirable to try to get the areas 136 and 138 to be equal in size, and then sum of their enclosed area to equal the area 134.

Figure 10:
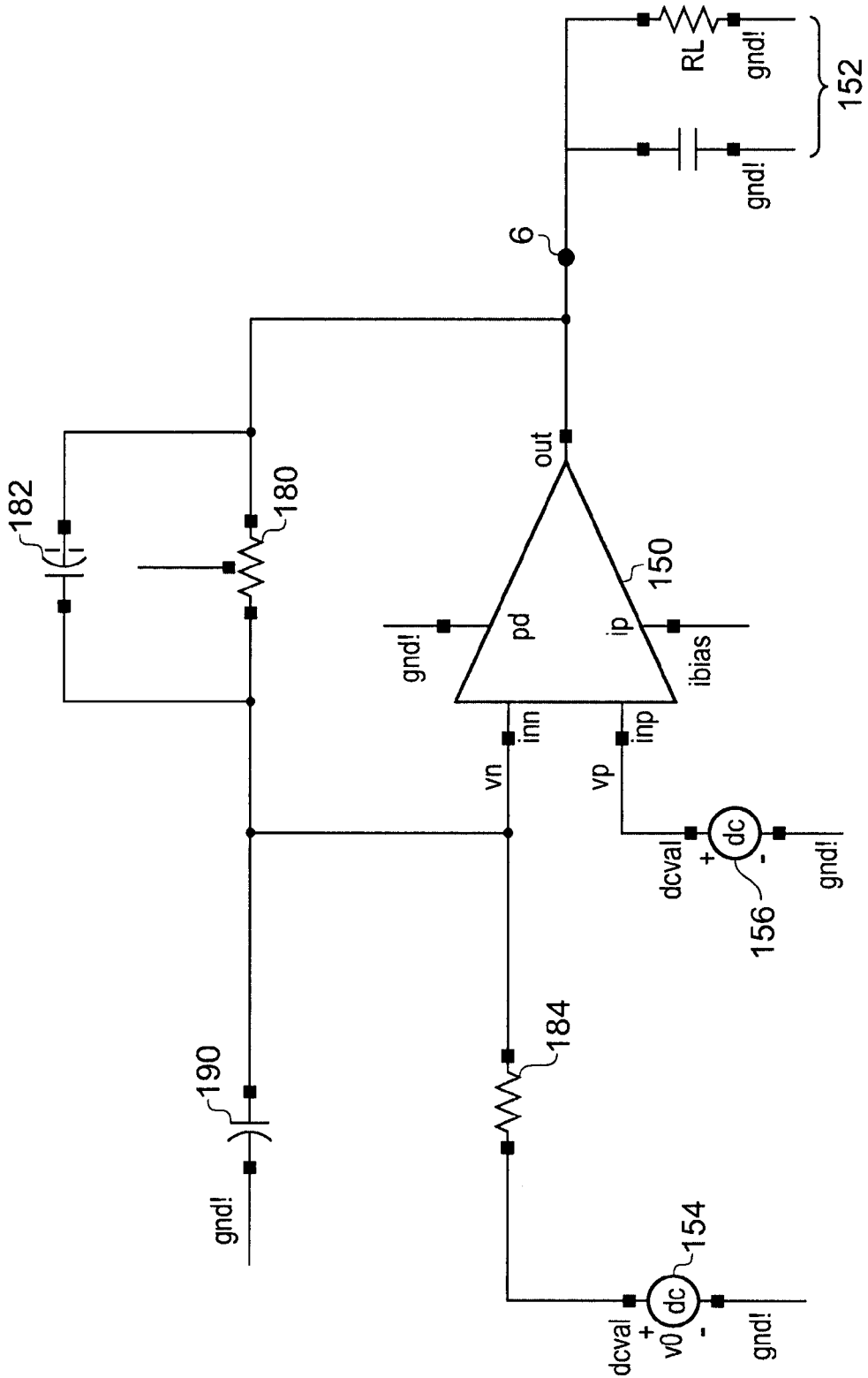
FIG. 10 illustrates an amplifier constituting an embodiment of the present invention in association with a feedback circuit.

In order to consider the simpler case of returning some of the energy that was lost into the area designated 136 in FIG. 9, consider the circuit arrangement shown in FIG. 10. Here the amplifier 150 represents both the input stage preamplifier 2 of FIG. 5 together with the output stage comprising transistors 4, 6 and floating voltage source 100. The amplifier 150 is connected to a load, designated 152 and assumed to comprise both a capacitance and a resistance to ground. The amplifier 150 receives a signal to be amplified, which can be supplied from either voltage source 154 connected to the inverting input of the amplifier 150, voltage source 156 connected to the non-inverting input of the amplifier 150 or both voltage sources 154 and 156 where the amplifier is driven in a differential mode. A feedback loop comprising resistor 180 in parallel with capacitor 182 and a further resistor 184 in series between the voltage source 154 and tie non-inverting input is provided, as is known to the person skilled in the art.

The feedback loop acts to compare the voltage at the output node 6 with the voltage at the inputs of the amplifier 150, to amplify any error therebetween and to provide a correction to the output node 6. The feedback loop is maintained operative whilst the amplifier 150 is driving a positive half cycle into the load 152 and whilst the amplifier 150 is driving a negative half cycle but is not engaged in recharging of the floating energy supply.

Returning to FIG. 6, it can be seen that when it is desired to recharge the capacitor 100, both transistors P1 and N1 within the amplifier have to be switched into a non-conducting state. It can be seen that this causes the feedback loop to be broken. During this time an error occurs between the voltage that actually occurs at the output node 6 and that which should occur at the output node 6. In order to account for this error, a further capacitor 190 is provided which extends between the non-inverting input of the amplifier 150 and ground, and which in use acts to integrate the error that occurs during the recharging period. In turn, once normal operation of the feedback loop is established, the amplifier must then seek to overcompensate for the error before the voltage at the output node 6 can return to its proper value. This gives a way of returning some of the "lost" area under the output curve that occurs during recharging, thereby compensating for some of the power that was not dissipated into the load during the recharging moment.

It can be seen that a similar pre-compensation could be provided by causing some overdrive at the output just prior to operation of the recharge circuit. For optimum performance this over voltage should represent a portion, for example half, of the missing energy that is failed to be delivered during the output refresh. The other portion, e.g. half, of the missing energy is then delivered after the refresh cycle. The two halves should be balanced in the time domain around the centre of the refresh so that there is little or no phase error between the missed energy and the compensation. The overdrive can be achieved by driving the amplifier with a temporarily increased signal that is proportional to the signal that would have been driven by the amplifier in the absence of the overdrive condition.

Figure 11:
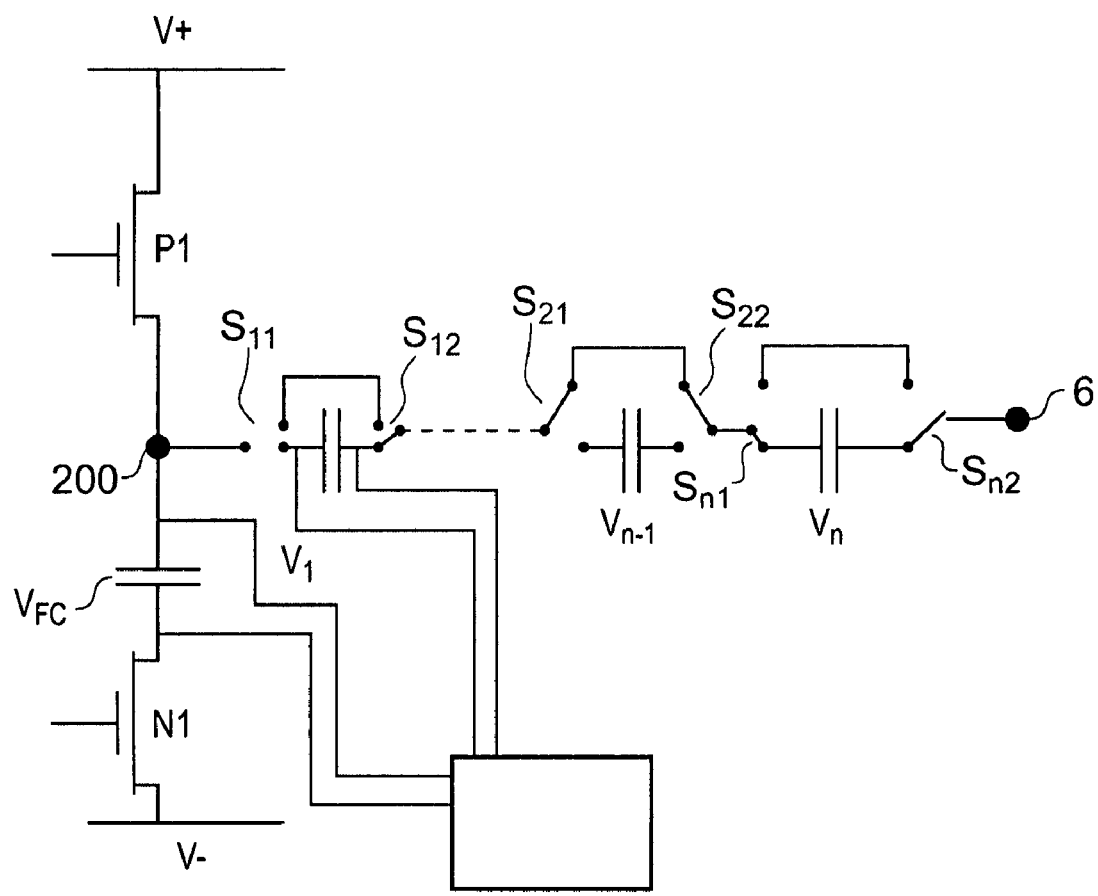
FIG. 11 illustrates an output stage constituting a further embodiment of the present invention.

Although the invention as described hereinbefore has been directed to extending the voltage swing at an output stage of an amplifier so as to swing negative with respect to the available supply, it can be seen that the extension can occur either side of the voltage supply rails to the integrated circuit. FIG. 11 shows an embodiment of the present invention where a series of voltage sources can be selectively connected between the output node 6 and an internal node 200 representing the connection between the transistor P1 and the transistor N1. Each of the voltage sources V1 to Vn can be selectively switched into or removed from the circuit by associated switches s11, s12, s21, s22, sn1, sn2 where associated pairs of switches work in unison. Thus, switches s11 and s12 work together so as to either connect the first of voltage source V1 between the nodes 200 and 6 or to bypass the voltage source V1. The other switches work in a similar manner such that the contribution of each floating voltage source can be added to the voltage occurring at the node 200. The polarity across each voltage source is freely determinable by the way in which the voltage source is recharged, and hence each one of the voltage sources can either add or subtract a voltage from the voltage at the node 200. The voltage sources can be recharged as described hereinbefore by briefly switching them out of the current flow path between node 200 and node 6, and into a recharge path. A closed loop around the amplifier circuit can then compensate for the changes in the voltage across each capacitor as it discharges. Optionally the floating voltage source $V_{FC}$ between N1 and node 200 can be included or omitted, at the discretion of the designer.

Although the invention has been described with respect to charging the capacitors by briefly disconnecting them from the output circuit and connecting them between the power supply rails, other techniques for charging the floating energy stores are also possible. Thus, inductors could be used. Transistors would be used to switch an inductor into a current flow path between the voltage supply rails so as to induce current to flow in the inductor and thereby to cause a magnetic field to build up around the inductor. The inductor can then be placed in parallel with the floating energy store and the current flow path between the voltage supply rails broken. The collapsing magnetic field around the inductor causes energy to be transferred into the floating energy store. This technique has the advantage that the energy store does not need to be removed from the output circuit for charging, although it does have the disadvantage of using inductors which are not favored within integrated circuits because of the difficulty it fabricating them and the space that they take up. However, if the inductors are provided as external components then these problems are immediately overcome. An inductor, or other recharge circuit, can be shared between several of the floating capacitors in one or more output channels.

Furthermore, a capacitor can also be used to recharge the energy store in a similar manner.

As noted hereinbefore, it may be advantageous to provide additional circuitry for measuring the load current and the refresh current.

Figure 12:
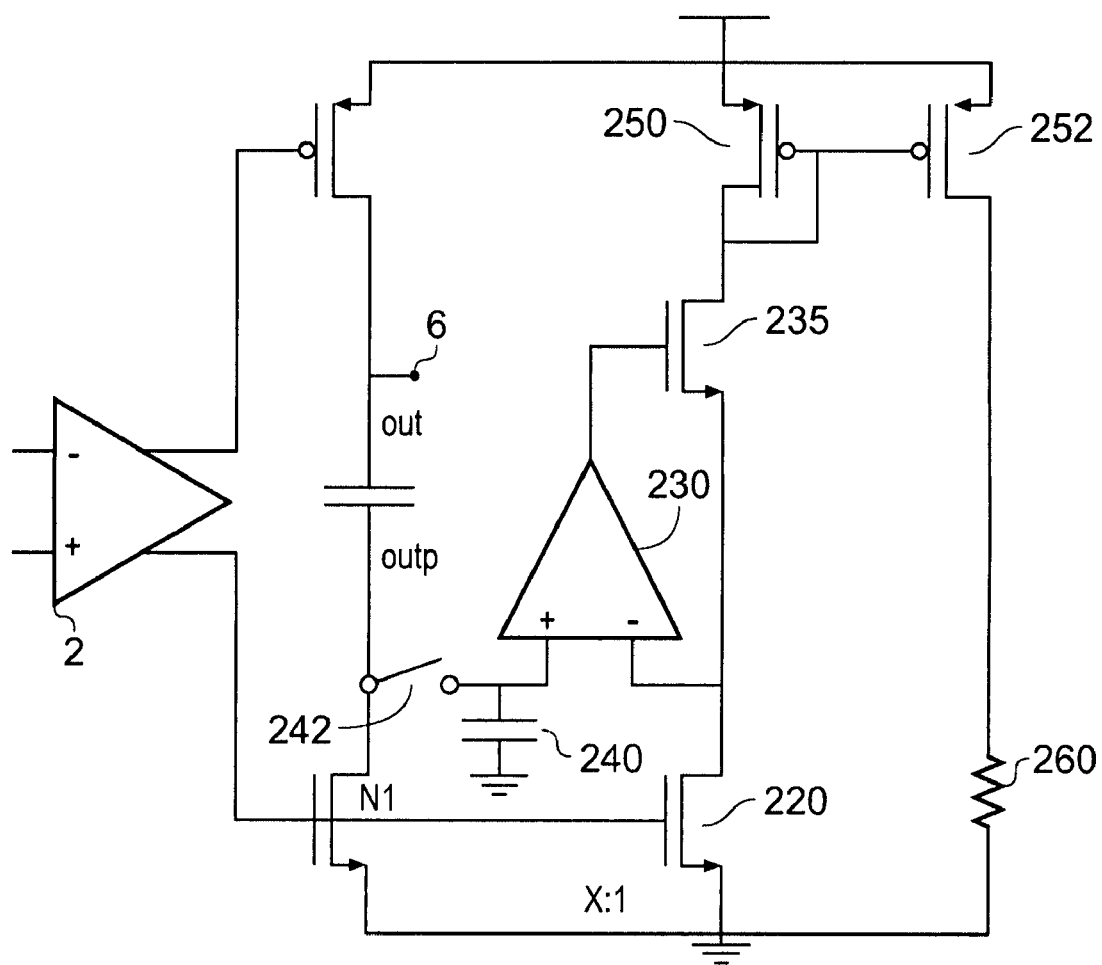
FIG. 12 illustrates a modification to enable the output current to be measured.

FIG. 12 illustrates the circuit for measuring the load current in which a measurement transistor 220 is fabricated which has its gate connected to the gate connection of the transistor N1, but which has an area considerably smaller than that of N1, for example 1000 times smaller such the current flow through the transistor 220 is proportionally scaled to that of the transistor N1. However, the ratio is determinable by the circuit designer so is designed X:1.

In order for the current flow through the transistor 220 to match that occurring through the transistor N1, subject to the scaling provided by the relative transistor sizes, then the drain source voltage occurring across the transistor 220 must be made to closely match that occurring across the transistor N1. In order to do this an operational amplifier 230 and field effect transistor 235 are provided. The transistor 235 has its gate connected to an output of the operational amplifier 230 whereas its source is connected to the drain of the transistor 220 which in turn is also connected to the inverting input of the amplifier 230. A non-inverting input of the amplifier 230 is connected to a sample capacitor 240 which can be selectively connected to the drain of the transistor N1 via a switch 242. If switch 242 is temporarily closed on a periodic basis, then the capacitor 240 will sample the voltage occurring at the drain of the transistor N1. The action of the operational amplifier and the transistor 235 will be to try and cause the voltage occurring at the inverting input of the amplifier 230 to match the voltage occurring at the non-inverting input thereof. Therefore the drain source voltage across the transistor 220 will be held to be substantially equal to the drain source voltage occurring across the transistor N1 at the sampling instant. Given that the drain source voltage across the transistor 220 is the same as the drain source voltage across the transistor N1, and that the gate source voltage at the gate of transistor 220 is equal to the gate source voltage of transistor N1, then the current flowing through the transistor 220 is proportional to that flowing through N1, and has a ratio which is determined by the relative sizes of the transistors. This current also flows through transistor 235 which in turn is connected to transistors 250 and 252 arranged in a current mirror configuration with the drain of transistor 250 being connected to the gate of the transistors 250 and 252 thereby ensuring that the current flowing through transistor 252 matches that flowing through transistor 250, which in turn matches that flowing through transistor 220. A resistor 260 is connected between the drain of the transistor 252 and ground, and the voltage developed across that resistor is a product of the resistance of that resistor and the current flowing through transistor 220. Therefore the voltage across the resistor can be measured in order to determine the current flow to the load connected to the node 6.

Figure 13:
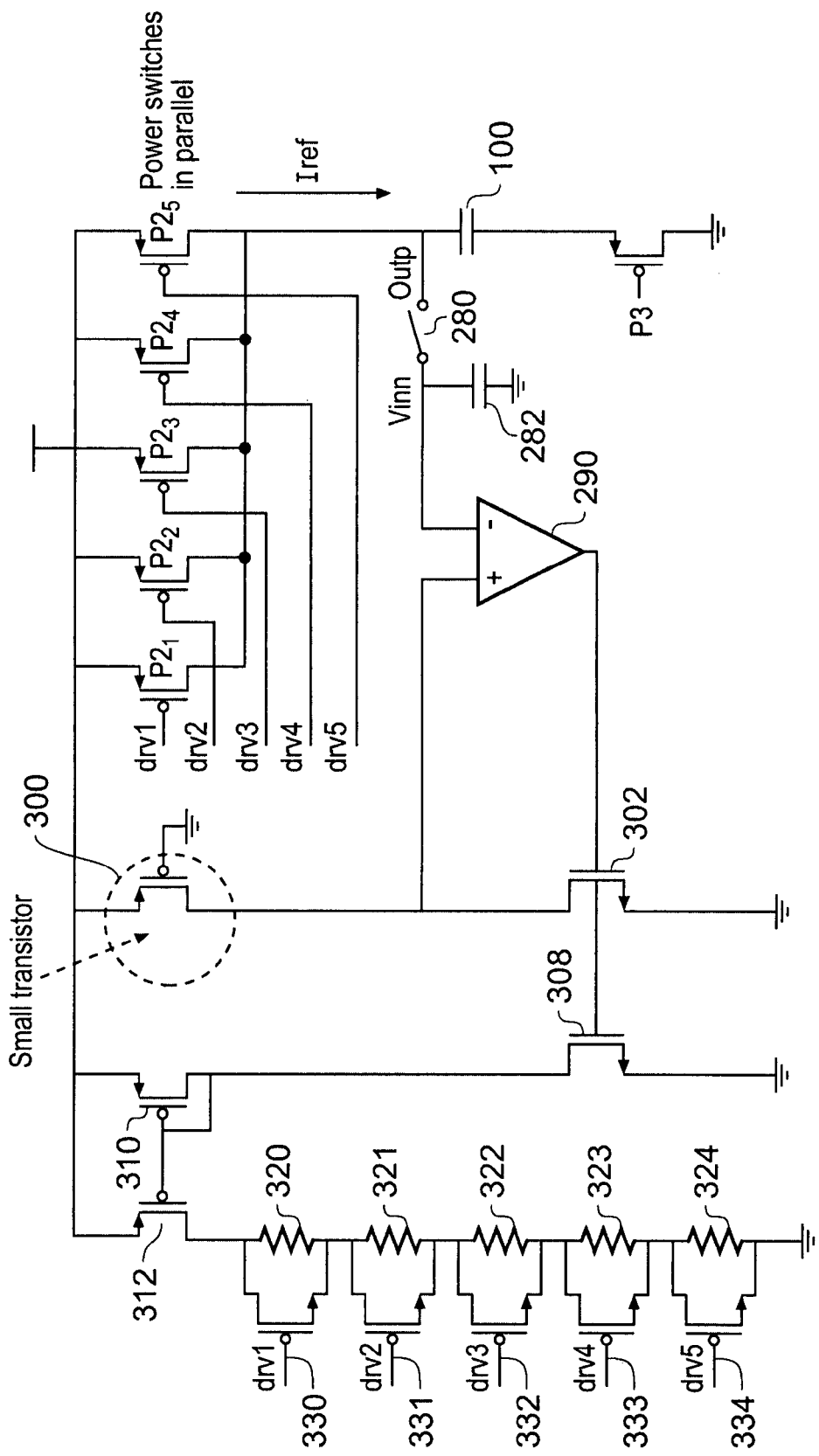
FIG. 13 illustrates a circuit for estimating the charging current.

It is possible to use a similar technique to measure the current flowing to the capacitor 100 during recharging. FIG. 13 shows a modification to the arrangement shown in FIG. 7. Five charging transistors $P2_1$ to $P2_5$ are shown, and each has its own individual drive circuit. For each transistor the gate source voltage could be assumed to be substantially constant. Therefore the current flowing through the transistor is reasonably well related to its drain source voltage. As a consequence, measuring the drain source voltage provides a way of estimating the current flowing to the capacitor 100. A sampling switch 280 is provided such that the voltage occurring across the transistors P2, to P25 during recharge can be sampled on to a capacitor 282. The sampling switch 280 need therefore only be closed very briefly in order to cause the capacitor 282 to track the voltage occurring across the transistors $P2_1$ to $P2_5$. The capacitor 282 is connected to the non-inverting input of an amplifier 290. A small transistor 300 representing a mirror of one of the charging transistors $P2_1$ to $P2_5$ has its source connected to the positive supply rail and its gate permanently connected to ground.

The transistor 300 is much smaller than any of the transistors $P2_1$ to $P2_5$ such that the current flowing therein is smaller than the recharge current, but is representative of the recharge current provided that the drain source voltage across a transistor 300 is the same as that occurring across the charge transistors $P2_1$ to $P2_5$. Under these circumstances the current will then be effected by the relative scaling of the small transistor 300 to each of the transistors $P2_1$ to $P2_5$ and also by the number of those transistors $P2_1$ to $P2_5$ which are switched on. The voltage occurring at the drain of the transistor 300 is supplied to the non-inverting input of the operational amplifier 290. An output of the amplifier 290 drives the gate of a N type transistor 302 which is in series with the transistor 300 and who's source is connected to ground. The feedback action around the amplifier 290 is such that the voltage occurring at the drain of the transistor 300 is set to be substantially equal to the voltage at the drains of the driving transistors $P2_1$ to $P2_5$ when they are recharging the capacitor 100 and consequently the current flowing the transistor 300 accurately represents the charging current to the capacitor 100. A transistor 308 forms a load to a further current mirror formed by transistors 310 and 312 and transistor 308 has its gate tied to the gate of transistor 302 and its source tied to ground such that the gate-source voltage across transistor 308 is the same as that for transistor 302. As a consequence the current flowing through the transistor 312 is proportional to the current flowing through transistor 300, which in turn is proportional to the charge current into the capacitor 100. The current flowing through transistor 312 then flows through five series connected resistors 320 to 324, each of which has a parallel shorting transistor 330 to 334. The voltage occurring at the drain of the transistor 312 is representative of the current recharging the capacitor 100.

However, a scaling problem exists because one, two, three, four or five of the transistors $P2_1$ to $P2_5$ may be on and therefore some form of scaling is required. In order to achieve this, each of the transistors 330 to 334 is arranged to be non-conducting when the corresponding transistor $P2_1$ to $P2_5$ is conducting. Therefore, if all five transistors $P2_1$ to $P2_5$ are conducting, then all of the transistors 330 to 334 are in a non-conducting state and the voltage occurring at the source of the transistor 312 is representative of the current into the capacitor 100. If, however, only one of the transistors $P2_1$ to $P2_5$ was conducting then for the same drain source voltage across that transistor the current in the capacitor 100 would be five times lower. In order to accurately reflect this, four of the resistors 320 to 324 would be shorted out thereby causing the voltage occurring at the drain of the transistor 312 to accurately represent the current into the capacitor 100.

Thus the circuits shown in FIGS. 12 and 13 allow both the load current and recharging current to be estimated. The load current can then be compared with the charging current in order to determine how many of the transistors $P2_1$ to $P2_5$ should be turned on in the next charging cycle.

In one embodiment of the invention if the charging current at a $K_{th}$ recharge event is less than five times the load current in one charging cycle, then the number of transistors $P2_1$ to $P2_5$ is incremented for a subsequent ($K+1_{th}$) charging cycle. However, if the charging current is greater than five times the load current, then the number of transistors switched on is decremented for the next recharging cycle. In any recharge cycle one of the transistors is always switched on thereby ensuring that a minimum level of recharge occurs. Similarly, once the recharge current exceeds a maximum threshold value and then no more transistors can be switched on.

This arrangement reduces the stress on the power supply to the circuit, and also seeks to limit the inrush currents to the capacitor 100 during charging, whilst ensuring that sufficient charge is placed on to the capacitor during each charging event for it to be able to hold the required voltage across it until the next scheduled recharging time.

As noted before, the interval between recharging events can also be randomized, and in an embodiment of the present invention the recharge rate can be varied between 1.9 and 2.1 MHz. It is thus possible to provide an inexpensive output circuit which allows for an enhanced voltage to be used to drive a load, without requiring a DC blocking capacitor.

Figure 14:
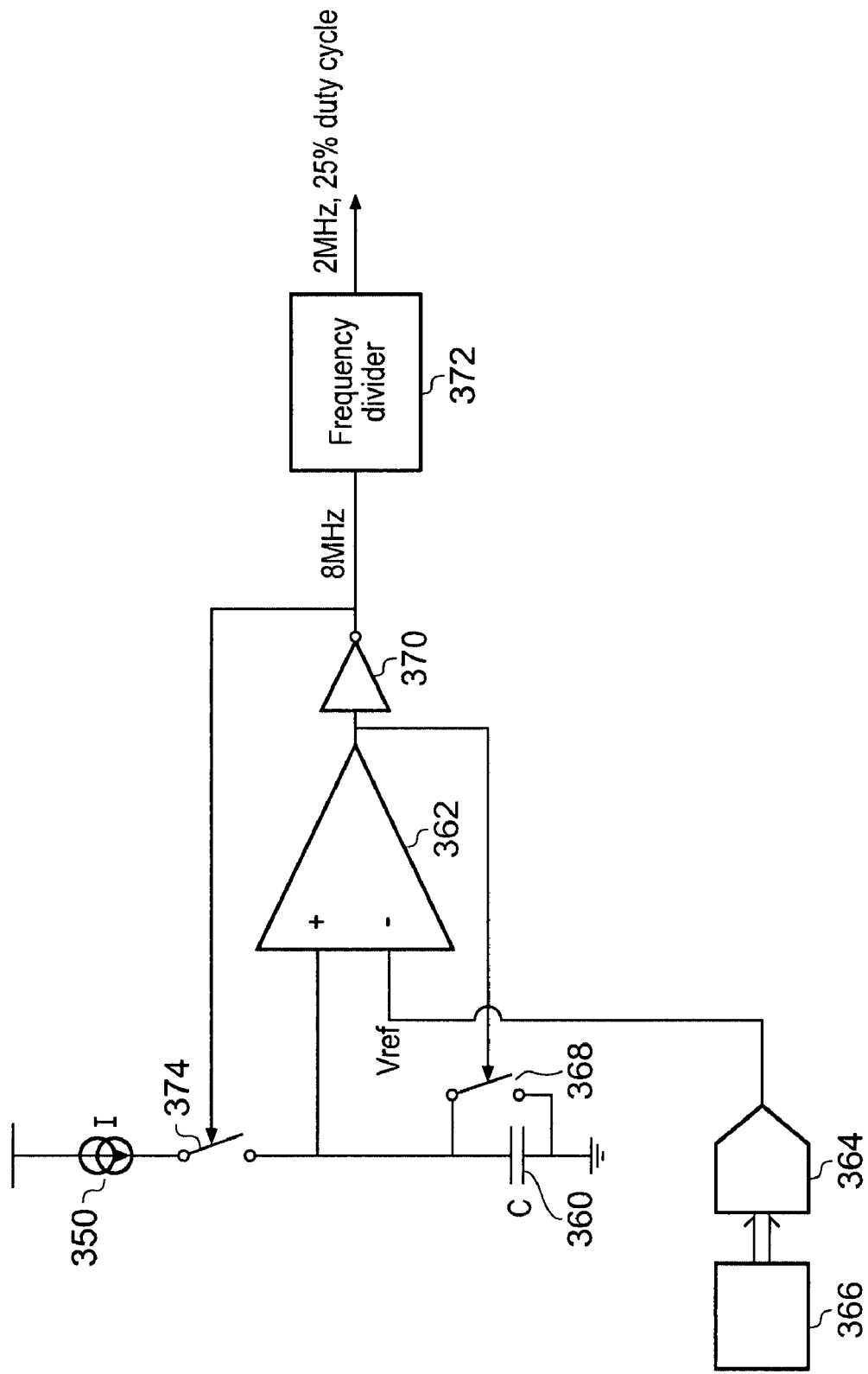
FIG. 14 shows an arrangement for dithering the recharge interval.

FIG. 14 shows a timing interval generator for generating the recharge signal, for example the "cap refresh" as illustrated in FIG. 6. A current source 350 is used to provide a current to charge a capacitor 360. A comparator 362 compares the voltage occurring at the capacitor with a reference voltage generated, for example, by a digital to analog converter 364 driven by a pseudo random number generator 366. When the voltage at the capacitor exceeds the reference voltage the comparator 362 outputs a signal which causes a capacitor discharge switch 368 to close so as to discharge the capacitor. An output of the comparator 362 is also provided to an inverter 370 which provides an output to a frequency divider 372 and also to the control terminal of a further switch 374 which interrupts the current flow path to the capacitor 360 during discharge. It should be noted that switch 374 could be omitted if desired. By providing a variable voltage reference signal the time taken for each capacitor recharge cycle varies slightly. This signal in an embodiment is then frequency divided to a signal in the range of 2 MHz±0.1 MHz.

It is thus possible to randomize in time the occurrences of the recharge events, thereby spreading the noise generated by recharge across the frequency domain.

It is possible to provide floating rechargeable energy stores in parallel. Thus, referring to FIG. 7 or 11 the or each capacitor could be implemented by two or more parallel capacitors such that one of the capacitors is being recharged whilst the other is being used. Such an arrangement is being in FIG. 15 which represents a variation on the circuit shown in FIG. 5.

Figure 15:
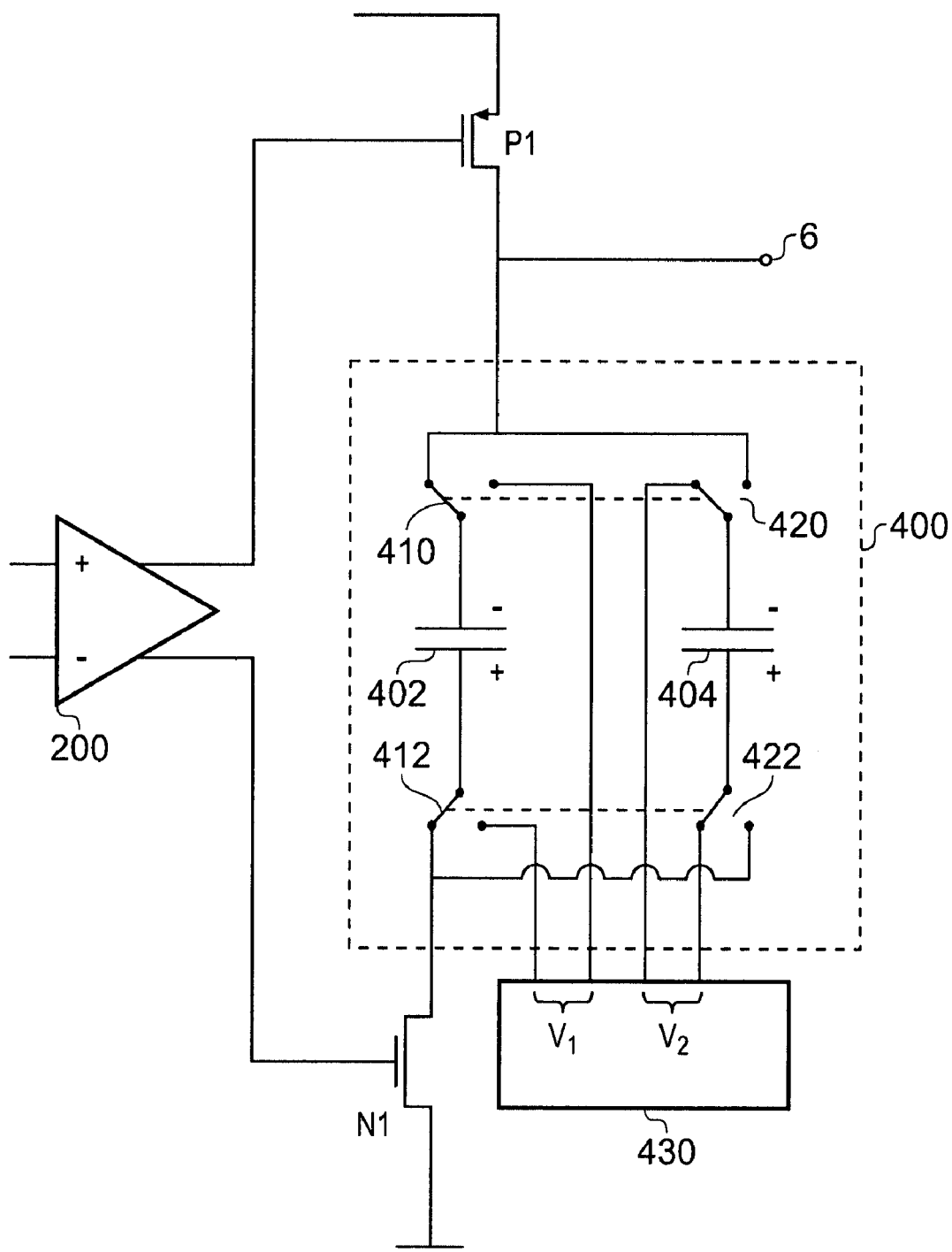
FIG. 15 illustrates a further embodiment where energy stores are provided in parallel such that one can be recharged while the other is in use.

If we compare FIG. 15 with FIG. 5, we see that an additional circuit 400 has been substituted in place of the capacitor 100. The circuit 400 comprises first and second capacitors 402 and 404 arranged in parallel. If we continue to use the terminology adopted for FIG. 5, then each of the capacitors 402 and 404 has a "positive" plate and a "negative" plate. The negative plate of capacitor 402 is associated with the switch 410 which is operable in a first switch position to connect the negative plate to the output node 6, and in a second switch position to connect the negative plate to a recharge circuit 430. A switch 412 is operable to connect the positive plate of the capacitor 402 to either the drain of transistor N1 or to the recharge circuit 430. Therefore it can be seen that the switches 410 and 412 can be operated to connect the first capacitor 402 between the output node 6 and the transistor N1, or optionally to disconnect the capacitor 402 and to connect it to the recharge circuit 430 for recharging.

The second capacitor 404 is similarly associated with switches 420 and 422 such that its negative plate can be optionally connected to the output node 6 or to terminals of the recharge circuit 430, and that its positive plate can be optionally connected to the drain of transistor N1 or to the recharge circuit 430. If the switches 410 and 412 act in unison, and in anti-phase to the switches 420 and 422, then it can be seen that the first capacitor 402 can be placed in the current flow path between N1 and the output node 6 whilst the second capacitor 404 is being charged. Once the first capacitor 402 becomes sufficiently discharged, then the switches are altered such that it is connected to the charging circuit 430 and the second capacitor 404 is placed between the output node 6 and N1. This means that either capacitor is, on average, being charged for the same duration that the other capacitor is being discharged, and hence the charge current into either capacitor can be reduced thereby reducing the strain on the power supply. Additionally the disruption to the output voltage at the output node 6 is also reduced. However, it can also be seen that a different mode of operation is possible and that the first capacitor 402 could remain permanently connected between the output node 6 and N1. The second capacitor 404 can be periodically recharged by the recharge circuit 430. When the voltage across the first capacitor 402 becomes diminished, second capacitor 404 can be placed in parallel with it such that charge redistribution between the capacitors causes the first capacitor 402 to become recharged. The capacitor 404 can then be removed from parallel connection with the capacitor 402 and reconnected to the recharge circuit 430. In this arrangement the feedback circuit around the amplifier never has to be broken and consequently perturbations in the output voltage due to the recharging can be reduced.

The invention claimed is:

1. An output stage, comprising:
a first transistor operable to pull a voltage at an output node towards a first voltage;
a rechargeable energy store having a potential difference between first and second terminals wherein the rechargeable energy store is arranged to be controllably connected between the output node and a second voltage supply such that the voltage at the output node can be driven to a voltage outside of a range defined between the first and second voltages; and
a charging circuit for recharging the rechargeable energy store.

2. An output stage as claimed in claim 1 further comprising a second transistor arranged to selectively connect a first terminal of the energy store to the second voltage supply, and wherein the second terminal of the energy store is connected to the output node.

3. An output stage as claimed in claim 2, in which the first voltage represents a positive supply rail when compared to the second voltage supply, and the second terminal of the rechargeable energy store is at a negative potential compared to the first terminal of the rechargeable energy store.

4. An output stage as claimed in claim 1, in which the rechargeable energy store comprises at least a first capacitor.

5. An output stage as claimed in claim 4, further comprising a charging circuit for recharging the first capacitor.

6. An output stage as claimed in claim 5, in which the charging circuit comprises a first recharging switch for connecting a first terminal of the recharging switch for connecting a first terminal of the rechargeable energy store to a first recharge voltage and a second switch for connecting a second terminal of the rechargeable energy store to a second recharge voltage.

7. An output stage as claimed in claim 1, further including a recharge controller for controlling recharging of the rechargeable energy store.

8. An output stage as claimed in claim 1, fabricated using single well CMOS fabrication techniques.

9. An output stage as claimed in claim 1, in which the rechargeable energy store is recharged a plurality of times during output of a negative half cycle from the output state.

10. An output stage as claimed in claim 9, in which recharging occurs at recharging intervals defined by a recharge clock.

11. An output stage as claimed in claim 10, in which the recharge intervals are dithered so as to spread the frequency spectrum of noise created by the recharging of the energy store.

12. An output stage as claimed in claim 9, in which the recharge current is modulated.

13. An output stage as claimed in claim 12, in which the recharge current for a Kth recharge event is monitored and used to control the recharge current for a K+1th recharge event.

14. An output stage as claimed in claim 12, in which the plurality of transistors are provided in a recharge path, and the transistors are individually controllable so as to control the recharge current.

15. An output stage as claimed in claim 12, further including a load current monitor for monitoring a load current.

16. An output stage as claimed in claim 15, further including a recharge current monitor and a recharge current controller responsive to the load current monitor and the recharge current monitor for controlling the recharge current.

17. An output stage as claimed in claim 16, in which the recharge current for a Kth recharge event is compared with a threshold that varies as a function of the measured load current, and if the recharge current is below the threshold then the recharge current for a K+1th recharge event is increased.

18. An output stage as claimed in claim 17, in which the recharge current is controlled by controlling the number of parallel connected recharge transistors that are turned on during a recharge event.

19. An output stage as claimed in claim 16, in which if the recharge current exceeds a threshold which varies as a function of the load current, then the recharge current is decreased.

20. An amplifier having an output stage as claimed in claim 1.

21. An amplifier as claimed in claim 20, further including a feedback for compensating for error occurring at the output of the amplifier during recharging of the energy store during recharging.

22. An amplifier as claimed in claim 20, wherein recharging current and recharging intervals are varied so as to spread noise in the frequency domain.

23. An amplifier as claimed in claim 20, wherein the amplifier is operable in a low signal mode to conduct current through the energy store in positive half cycles and negative half cycles of an output signal.

* * * * *